United States Patent [19]

Yabe et al.

[11] Patent Number: 4,994,659
[45] Date of Patent: Feb. 19, 1991

[54] IC CARD

[75] Inventors: Isao Yabe, Tokorozawa; Yoshihiro Shimada, Tokyo; Kazumi Machida, Higashiyamato; Hiroyuki Kaneko, Kunitachi, all of Japan

[73] Assignee: Citizen Watch Col, Ltd., Tokyo, Japan

[21] Appl. No.: 314,332

[22] Filed: Feb. 22, 1989

[30] Foreign Application Priority Data

Apr. 28, 1988 [JP] Japan ................. 63-105611
May 27, 1988 [JP] Japan ................. 63-129850
Jun. 10, 1988 [JP] Japan ................. 63-141574

[51] Int. Cl.⁵ .......................... G06K 19/06
[52] U.S. Cl. ........................ 235/492; 235/488
[58] Field of Search ............. 235/488, 492; 357/72, 357/76, 84

[56] References Cited

U.S. PATENT DOCUMENTS 4,792,843 12/1988 Tehrani .
4,843,225 6/1989 Hoppr ....................... 235/492

FOREIGN PATENT DOCUMENTS 0140230 10/1984 European Pat. Off. .
500237 10/1984 Japan .

Primary Examiner—Harold I. Pitts
Attorney, Agent, or Firm—Townsend and Townsend

[57] ABSTRACT

An IC card includes an IC module and a card base. The IC module is constituted by a circuit board having contact patterns formed thereon and an IC chip mounted on the circuit board. The card base houses the IC module so as to expose the contact patterns. The circuit board of the IC module is constituted by a pattern portion on which the contact patterns are formed and bent portions formed by bending the pattern portion. The card base includes an opening for exposing the contact patterns of the IC module, and clamping portions, formed on peripheral portions of the opening, for fixing the bent portions. The bent portions of the IC module are fixedly clamped by the clamping portions such that the contact patterns are arranged on substantially the same plane as a surface of the card base.

10 Claims, 9 Drawing Sheets

IC CARD

BACKGROUND OF THE INVENTION

1. FIELD OF THE INVENTION

The present invention relates to an IC card and, more particularly, to a structure of an IC card for housing an IC module in a card base.

2. DESCRIPTION OF THE PRIOR ART

A rapid improvement has recently been made in development of an IC card incorporating an IC chip including a CPU and memories. Since this IC card has a larger storage capacity than a conventional IC card, its use in place of a bankbook or a credit card is taken into consideration.

A conventional IC card and an IC module housed in the IC card will be described with reference to the accompanying drawings.

Figure 1:
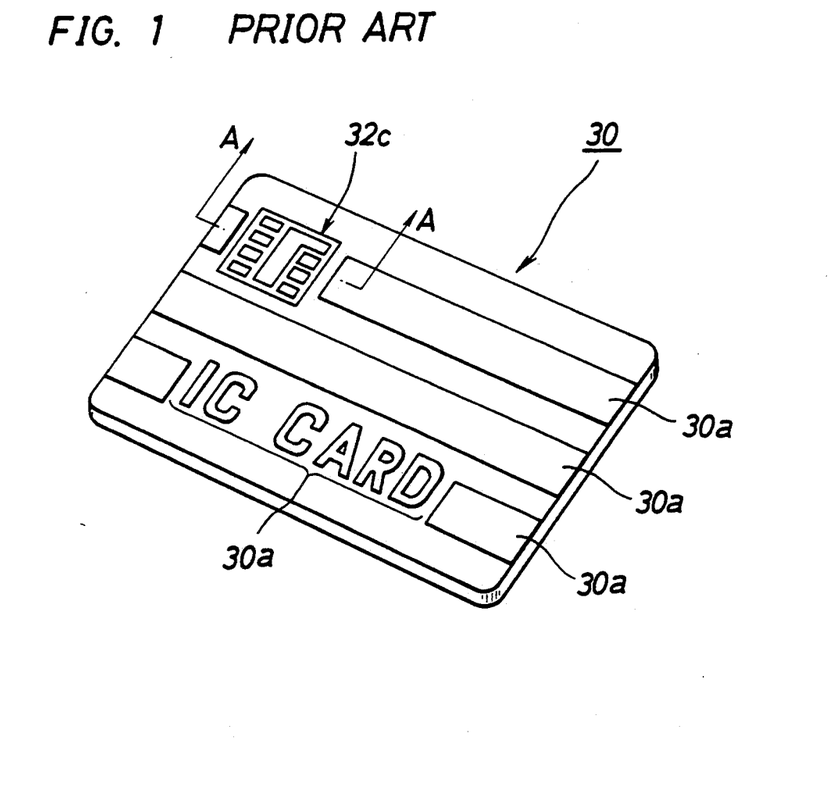
FIG. 1 is a perspective view showing an outer appearance of a conventional IC card.
Figure 2:
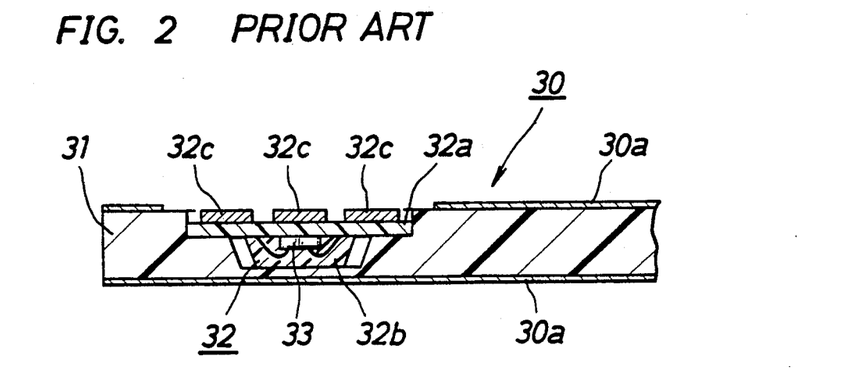
FIG. 2 is a sectional view taken along a line A - A in FIG. 1.
Figure 3:
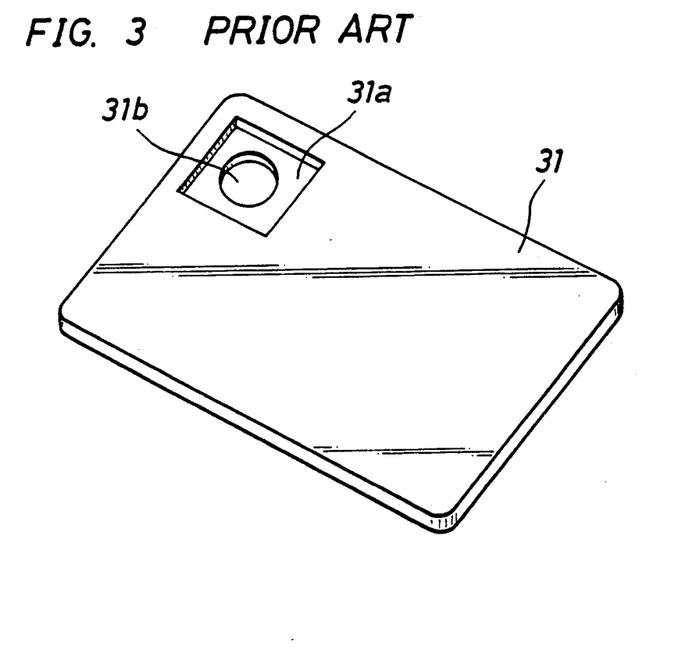
FIG. 3 is a perspective view showing an outer appearance of a card base of the conventional IC card.
Figure 4:
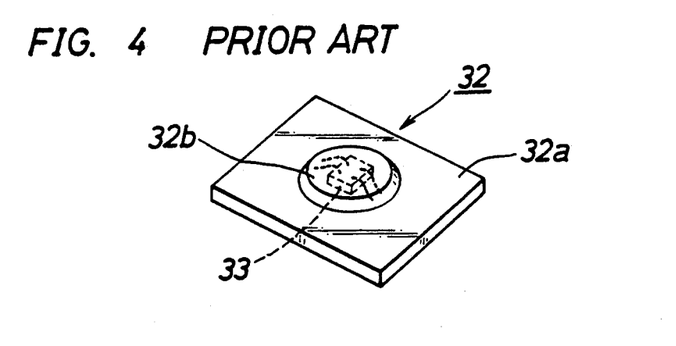
FIG. 4 is a perspective view showing an outer appearance of an IC module to be housed in the conventional IC card.
Figure 5:
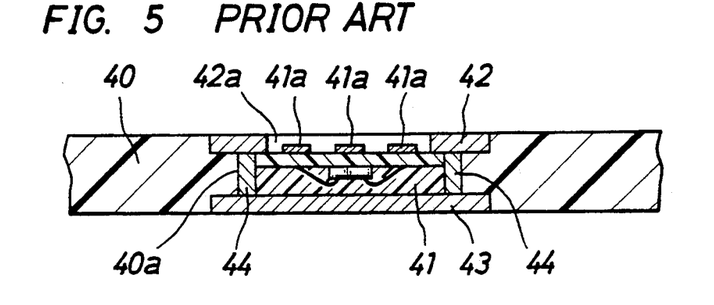
FIG. 5 is a sectional view showing an internal structure of a main part of another conventional IC card.

FIG. 1 is a perspective view showing an outer appearance of a conventional IC card. FIG. 2 is a sectional view taken along a line A - A in FIG. 1. FIG. 3 is a perspective view showing an outer appearance of a card base constituting the IC card. FIG. 4 is a perspective view showing an outer appearance of an IC module. FIG. 5 is a sectional view showing a main part of another conventional IC card.

Referring to FIG. 1, a plurality of contact patterns 32c of an IC module 32 (to be described later) are formed on a surface of an IC card 30 so as to be exposed. In addition, various print patterns 30a are formed on the same surface. An overall card shape is defined by a plastic card base 31 shown in FIG. 3. A board recess 31a and a sealing recess 31b for housing the IC module 32 are formed in the card base 31. The card base 31 is made of, e.g., ABS resin by injection molding. As shown in FIG. 4, the IC module 32 is designed such that an IC chip 33 is bonded to a circuit board 32a made of a glass epoxy resin, and a seal portion 32b is formed on the IC chip 33 by using a sealing resin, while the contact patterns shown in FIG. 1 are formed on the lower surface of the circuit board 32a.

As shown in FIG. 2, the seal portion 32b of the IC module 32 is housed in the sealing recess 31b of the card base 31, and the circuit board 32a is housed in the board recess 31a while the outer periphery of the board 32a is restricted by the recess 31a. In this case, the IC module 32 is housed such that the surface of the contact patterns 32c is located on the same plane as that of the card base 31. An adhesive (not shown) is coated between the circuit board 32a, the sealing portion 32b, the board recess 31a, and the sealing recess 31b, and is heated and hardened, thus fixing the IC module 32 to the card base 31.

Generally, the IC card 30 has a thickness of about 0.8 mm, and must have elasticity enough to allow bending to a certain extent so as not to be destroyed by an external force generated when a user carries or uses it. Therefore, it is required that the card base 31 has elasticity while the seal portion 32b of the IC module 32 has rigidity, and that the IC module 32 is firmly fixed to the card base 31.

Since the material of the circuit board 32a and the seal portion 32b constituting the IC module 32 is different from that of the card base 31, it is difficult to obtain an adhesive capable of reliably bonding them to each other. In addition, since a bonding force greatly varies, in the case of the above-described IC card 30, when the card base 31 is flexed, peeling occurs at a bonding portion between the card base 31 and the IC module 32. As a result, the IC module 32 is removed from the base 31.

When an adhesive is heated to be hardened, the adhesive leaks from a gap between the IC module 32 and the circuit board 32a depending on an amount of the adhesive and a bonding position. As a result, the surface of card base 31 on which the print patterns 30a are formed may be contaminated.

In addition, the card base 31 tends to be deformed because of heat generated when an adhesive is heated and hardened.

Moreover, an adhesive has poor handling properties and workability. Therefore, a demand has arisen for an IC card structure allowing an IC module to be housed in a card base without using an adhesive. For this purpose, Japanese Patent Laid-Open (Kokai) No. 61-204788 discloses an IC card structure for fixing an IC module to a card base without using an adhesive.

This IC card structure will be described in detail below with reference to FIG. 5. A through hole 40a is formed in a card base 40 constituting an IC card. An IC module 41 is housed in the through hole 40a through a ring-like coupling member 44. In addition, reinforcing members 42 and 43 are arranged on the upper and lower surfaces of the IC module 41 and are fixed to the card base 40. Note that a hole 42a is formed in the reinforcing member 42 on the side of contact patterns 41a so as to expose the contact patterns 41a.

According to the above-described IC card structure, if the reinforcing members 42 and 43 and the coupling member 44 are made of a metal material, they can be firmly coupled to each other by soldering or high-frequency welding. Therefore, unlike the conventional IC card, the card base and the IC module need not be integrally bonded to each other through an adhesive.

In the above-described IC card, however, the following problems are posed.

In the conventional IC card, in order to reliably connect contact patterns to an R/W (read/writer) unit for reading/writing data, the contact patterns are formed such that their surfaces are located on the same plane as the surface of the card base. In the IC card described above, however, since the reinforcing member 42 is thicker than each contact pattern 41a, the contact pattern 41a is placed at a position lower than the surface of the card base 40. For this reason, connection between the contact patterns 41a and the R/W unit becomes unstable.

In addition, even if the outer size of the IC module 41, the inner and outer diameters of the coupling member 44, and the inner diameter of the through hole 40a are slightly deviated in size, fixing of the IC module becomes unstable. This may cause a positional error of the contact patterns 41a. Moreover, in this IC card structure, only the reinforcing members 42 and 43 and the coupling member 44 are bonded to each other, and hence the card base 40 and the IC module 41 are not firmly fixed to each other. Therefore, while a user carries the IC card, the positions of the base 40 and the module 41 may be offset. This may cause a positional error of the contact patterns 41a. Therefore, in order to solve this problem, an adhesive must be locally applied to the IC module 41 and the card base 40 in the same manner as in the IC card shown in FIG. 2.

SUMMARY OF THE INVENTION

It is an object of the present invention to provide an IC card structure which can solve the above-described problems and in which a card base and an IC module of an IC card can be fixed to each other without using an adhesive, and contact patterns of the IC module can be placed on the same plane as a surface of the card base.

In order to achieve the above object according to the present invention, a circuit board of an IC module is provided with a flat pattern portion, in which contact patterns to be connected to an external circuit are formed, and a bent portion formed by bending the flat pattern portion. An opening for exposing the contact patterns of the IC module and a clamping portion for fixing the bent portion to the peripheral portion of the opening are formed in a card base for housing the IC module. The bent portion of the IC module is fixedly clamped by the clamping portion such that the contact patterns are placed on substantially the same plane as the surface of the card base.

According to a first aspect of the present invention, an IC card comprises an IC module which has a circuit board having contact patterns on one surface thereof and an IC chip mounted on the other surface, a card base having a through hole for housing the IC module, and a cover for fixing the IC module in the through hole of the card base, wherein the through hole is provided with an opening for exposing the contact patterns of the IC module, and a housing portion formed so as to be continuous with the opening and to have a larger diameter than the opening, the circuit board of the IC module is constituted by a pattern portion in which the contact patterns are formed, and a peripheral portion formed from the pattern portion upon bending thereof, and the IC module is fixed to the card base by clamping the peripheral portion of the circuit board between the housing portion and the cover.

In addition, the IC module may be positioned such that the peripheral portion of the circuit board is engaged with a projection formed on the housing portion of the card base or the cover.

Moreover, a bent pattern of the circuit board of the IC card may be formed from the pattern portion to the peripheral portion.

According to a second aspect of the present invention, an IC card comprises an IC module including a circuit board having contact patterns on one surface thereof and an IC chip mounted on the other surface, a card base having a recess for housing the IC module, and a fixing member for fixing the IC module housed in the recess, wherein the circuit board of the IC module is provided with a pattern portion in which the contact patterns are formed, and an outer peripheral portion formed by bending the flat pattern portion, the recess of the card base is provided with a base holding portion for holding the pattern portion so as to place the contact patterns of the IC module on the same plane as a surface of the card base, and a groove, formed in a periphery of the base holding portion, for holding the outer peripheral portion of the IC module, the pattern portion and the outer peripheral portion of the IC module are respectively arranged in the base holding portion and the groove of the card base, the fixing member is engaged with and fixed to the groove so as to clamp the outer peripheral portion, and the circuit board of the IC module is positioned such that a hole formed in the outer peripheral portion is engaged with a projection formed on the groove of the card base.

According to a third aspect of the present invention, an IC card comprises an IC module including a circuit board having contact patterns on one surface thereof and an IC chip on the other surface, and a card base having a recess for housing the IC module, wherein the circuit board of the IC module is provided with a pattern portion in which the contact patterns are formed, and an outer peripheral portion formed by bending the pattern portion, the recess of the card base includes a base holding portion for holding the pattern portion of the IC module, and a groove for holding the outer peripheral portion while a cover for sealing an upper surface of the groove is integrally formed with recess, and the IC module is fixed such that the outer peripheral portion is clamped by the cover after the pattern and the peripheral portion are respectively housed in the base holding portion and the groove of the card base.

DETAILED DESCRIPTION OF THE PREFERRED EMBODIMENTS

Figure 6:
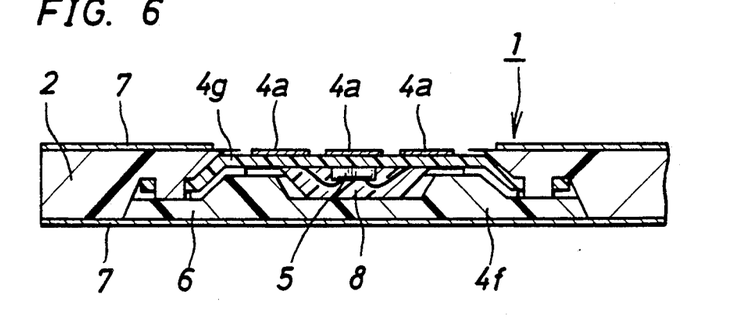
FIG. 6 is a sectional view showing an internal structure of a main part of an IC card according to a first embodiment of the present invention.
Figure 7A:
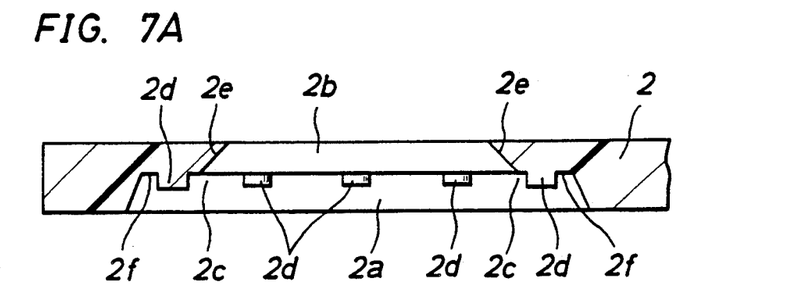
FIG. 7A is a sectional view showing a main part of a card base of the IC card in FIG. 6.
Figure 7B:
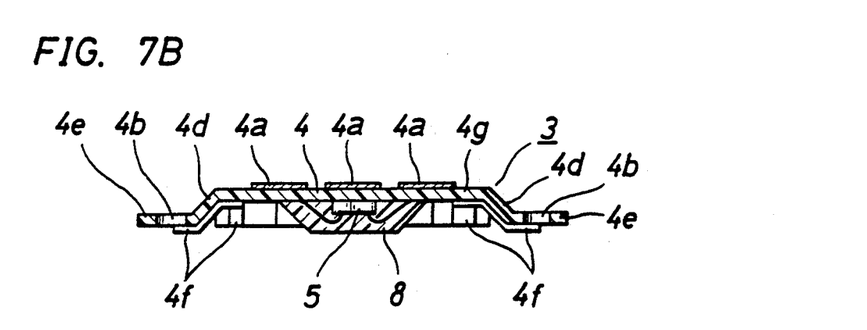
FIG. 7B is sectional view showing an IC module of the IC card in FIG. 6.
Figure 7C:
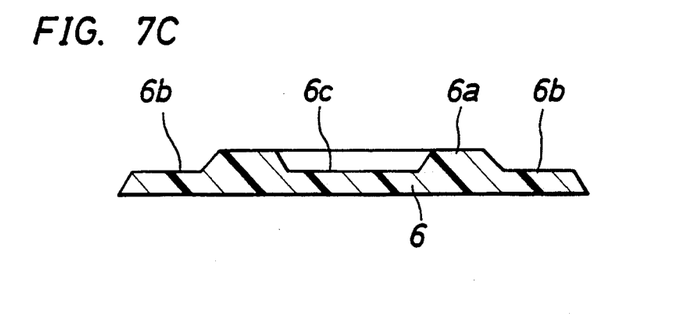
FIG. 7C is a sectional view showing a base used for the IC card in FIG. 6.
Figure 8:
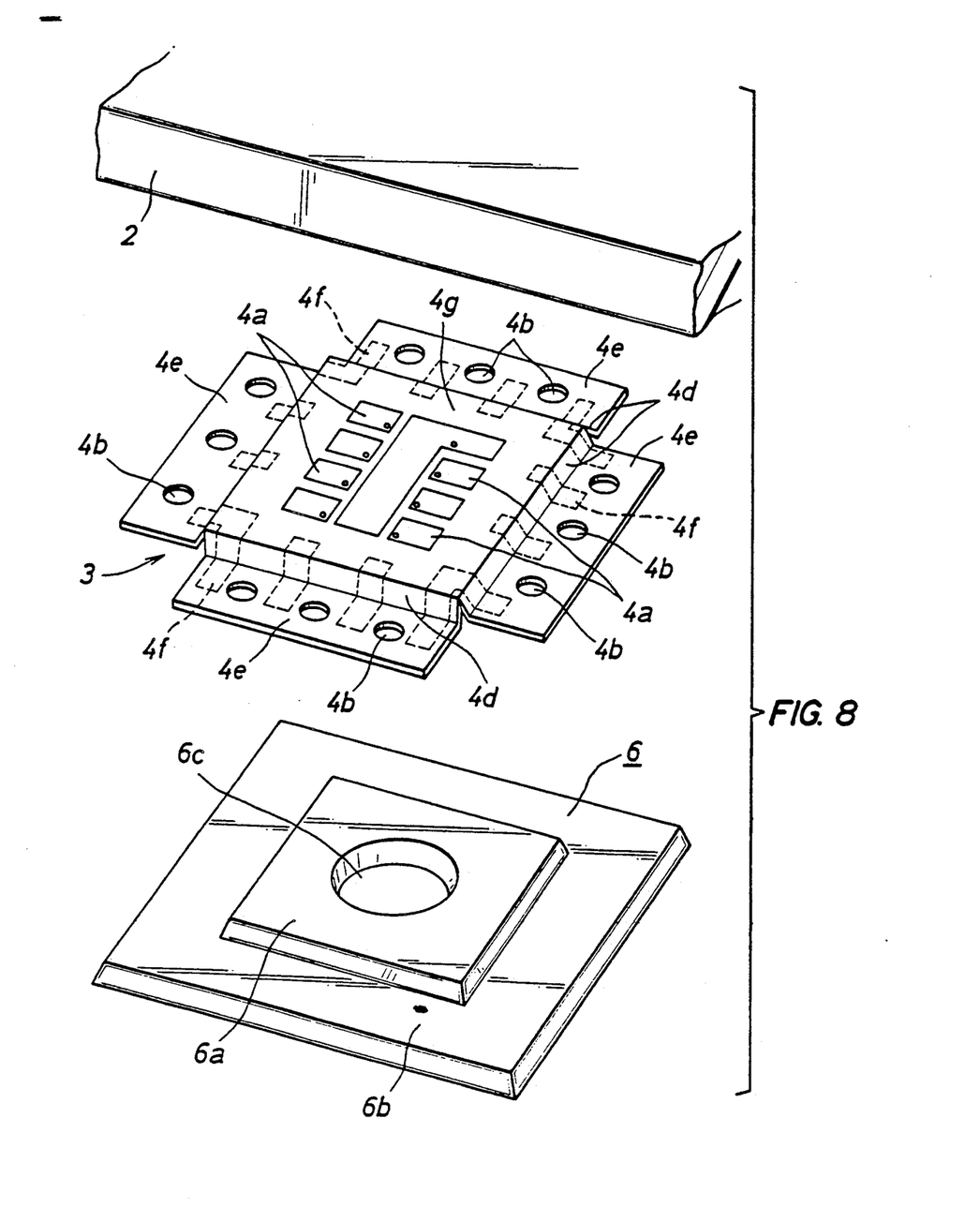
FIG. 8 is an exploded perspective view showing a main part of the IC card in FIG. 6.

Embodiments of the present invention will be described below with reference to the accompanying drawings. FIG. 6 is a sectional view showing a main part of an IC card according to a first embodiment of the present invention. FIG. 7A is a sectional view showing a main part of a card base. FIG. 7B is a sectional view of an IC module. FIG. 7C is a sectional view of a cover. FIG. 8 is a perspective view showing an assembly structure of the IC card in FIG. 6. Note that the outer appearance of the IC card of the present invention is the same as that of the conventional IC card shown in FIG. 1, and hence a description thereof will be omitted.

Referring to FIG. 6, an IC card 1 comprises a plastic card base 2 made of ABS resin or the like by injection molding, an IC module 3, and a cover 6. Printed sheets 7 are formed on surfaces of the card base 2 and the cover 6.

As shown in FIG. 7A, a through hole 2a for storing the IC module 3 is formed in the card base 2. The through hole 2a consists of an opening 2b for exposing contact patterns 4a of the IC module 3, and a housing portion 2c which is formed so as to be continuous with the opening 2b and to have a larger diameter than the opening 2b. The housing portion 2c includes recesses 2f and slopes 2e. In addition, a plurality of projections 2d are formed on the recesses 2f.

As shown in FIG. 7B, the IC module 3 includes a flexible circuit board 4 and an IC chip 5. The IC chip 5 is bonded to the lower surface of the circuit board 4. A seal portion 8 is formed by a sealing resin. The contact patterns 4a are formed on the upper surface of a pattern portion 4g of the circuit board 4, and holes 4b are formed in outer peripheral portions 4e so as to be respectively engaged with the projections of the card base 2. In addition, a bent portion 4d is formed between the pattern portion 4g and each outer peripheral portion 4e so as to have two folds. The shape of each bent portion 4d is formed so as to be matched with the shape of the slope 2e. As described above, since the circuit board 4 is flexible, the bent portions 4d are formed by bending the circuit board 4 while heating it.

If the circuit board 4 is overheated when the bent portions 4d are heated, the board 4 tends to be damaged. For this reason, bent patterns 4f are formed on the lower side between the pattern portion 4g and the outer peripheral portions 4e. Similar to the contact patterns 4a, the bent patterns 4f are constituted by copper film patterns, and hence tend to accumulate heat when heated. For this reason, upon formation of the bent patterns 4f, heat generated by even a small amount of heating energy is not easily dissipated. Therefore, the bent portions 4d can easily formed on the circuit board 4.

In addition, the shape retentivity of the bent patterns 4f serves to maintain the shape of the bent portions 4d and enhance the strength of the folds.

As shown in FIG. 7C, the cover 6 is made of the same plastic material as that of the card base 2. A board holding portion 6a for holding the IC module 3 from its lower surface, and a sealing recess 6c in which a seal portion 8 of the IC module is housed are formed on the cover 6.

An assembly structure of the IC card 1 will be described below. As shown in FIG. 8, the IC module 3 is stored in the through hole 2a from the lower surface of the card base 2 while the bent portions 4d are formed. As shown in FIG. 6, the IC module 3 is held in the opening 2b such that the contact patterns 4a are placed on the same plane as the surface of the card base 2. At the same time, the bent portions 4d are respectively engaged with the slopes 2e, and the outer peripheral portions 4e are held in the recesses 2f while the holes 4b are engaged with the projections 2d. In addition, as shown in FIG. 6, the cover 6 is mounted on the card base 2 so as to seal the IC module 3 in the through hole 2a. Subsequently, the IC module 3 is clamped and fixed between the board holding portion 6a, an outer peripheral portion holding portion 6b of the cover 6, the recesses 2f, and the slopes 2e of the card base 2.

In addition, the projections 2d, the holding portion 6b, the outer periphery of the cover 6, and the inner periphery of the through hole 2a are fixed by ultrasonic fusing. As described above, since the card base 2 and the cover 6 are made of the same plastic material, very high fixing strength can be obtained. In addition, a plastic material fused upon ultrasonic fusing does not leak from a gap between the cover 6 and the card base 2, and hence a relatively flat card base 2 can be formed.

A slight mark is left at a fused portion of the card base 2 and the cover 6. However, such a mark can be hidden by attaching the thin printed sheets 7 to the surfaces of the card base 2 and the cover 6 except for a portion where the contact patterns are exposed. Thus, the surfaces of the IC card can be beautifully finished. Instead of using the sheets 7, graphic patterns, designs, and the like may be directly printed on the surfaces of the card base 2 and cover 6 to hide the mark, and the resultant surfaces may be subjected to a hard coat process using a transparent resin. This applies to the following embodiments.

In the above embodiment, if the cover 6 is made of a transparent material, such as BS (butadiene-styrene) resin, and the printed sheet 7 is provided except for a portion corresponding to the contact patterns 4a and a corresponding portion of cover 6, a user of the IC card can see the IC module 3 housed in the card base 2 from the outside through the cover 6. Therefore, the storage position of the IC module 3 can be confirmed, and the user can pay attention not to carelessly depress the corresponding portion of the cover 6. Thus, this arrangement is advantageous in careful handling of the IC card.

Figure 9:
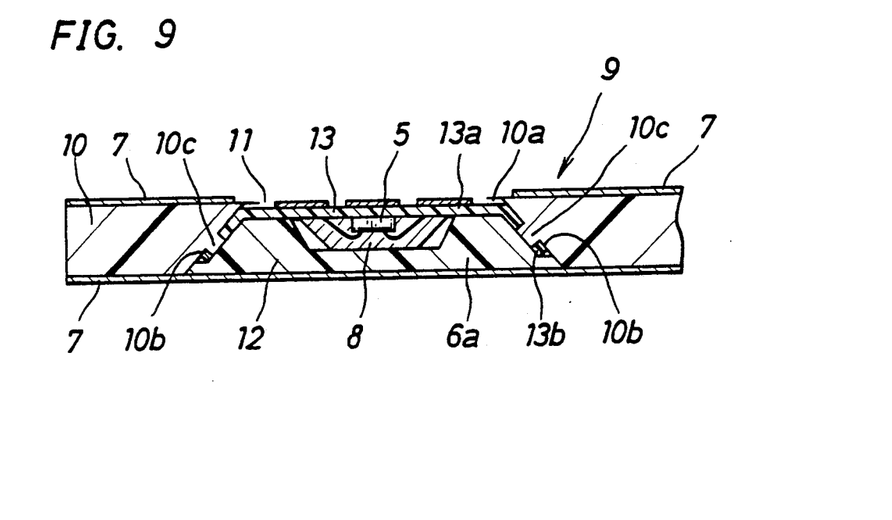
FIG. 9 is a sectional view showing an internal structure of an IC card according to a second embodiment of the present invention.

A second embodiment of the present invention will be described with reference to FIG. 9.

An IC card 9 of this embodiment comprises a card base 10, and an IC module 11, and a cover 12. Slopes are formed between an opening 10a and storage portions 10b. Portions from a pattern portion 13a to outer peripheral portions 13b are bent in accordance with the slopes. Similar to the first embodiment, the IC module 11 is positioned by engaging the outer peripheral portions 13b with projections 10c of the card base 10. In addition, the cover 12 having a board holding portion 6a is arranged on the lower surface side of the IC module 11, and the card base 10 and the cover 12 are fixed to each other by ultrasonic fusing in the same manner as in the first embodiment.

Figure 10:
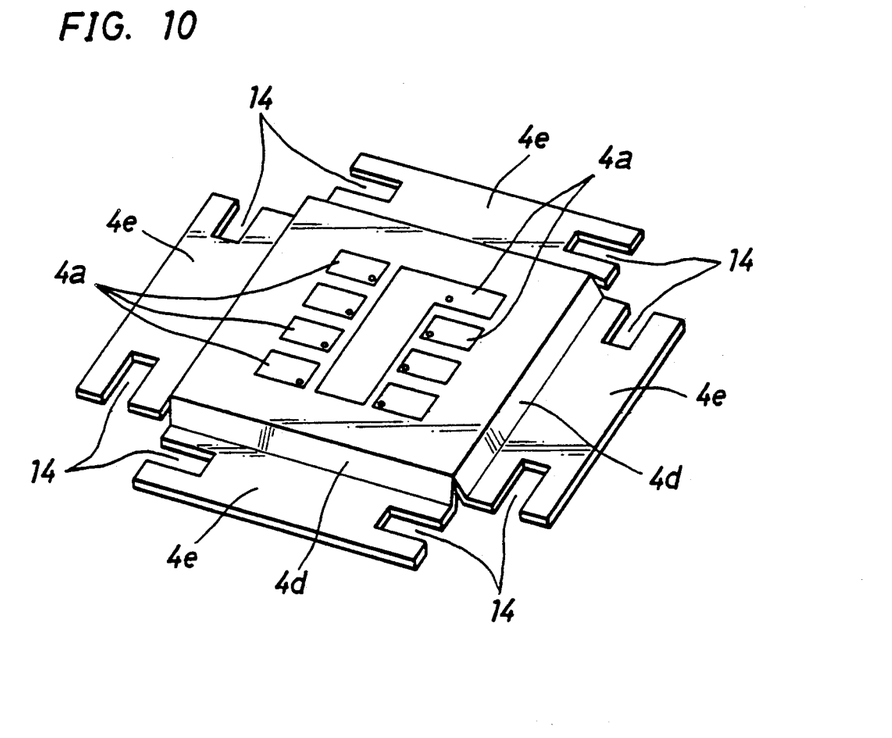
FIG. 10 is a perspective view showing another IC module used in the first embodiment.

In the two embodiments described above, in order to position the IC modules, the holes are formed in the outer peripheral portions of each circuit board, and are engaged with the projections of each card base. However, the present invention is not limited to this arrangement. As shown in FIG. 10, notched portions 14 may be formed in place of the holes. In addition, the projections to be engaged with the holes of the circuit board may be formed in the cover. Note that the same reference numerals in FIG. 10 denote the same parts as in FIG. 8.

According to this embodiment, a circuit board of IC module is provided with a pattern portion in which contact patterns are formed, and outer peripheral portions formed by bending the pattern portion. In addition, a through hole formed in a card base comprises an opening of exposing the contact patterns and a housing portion having a larger diameter than the opening. The IC module is fixed to the card base in such a manner that the outer peripheral portions are clamped between the housing portion of the card base and the cover, and the card base and the cover are fixed to each other. Therefore, the IC module can be firmly fixed to the card base without using an adhesive. In addition, since the portions from the pattern portion to the outer peripheral portions are bent, the IC card can be arranged while the contact patterns are located on the same plane as the surface of the card base.

The holes or notches formed in the outer peripheral portions of the circuit board are engaged with the projections formed on the housing portion of the card base or the cover so that when the IC module is incorporated in the IC card, its positioning can be facilitated. In addition, this arrangement can prevent removal of the IC module from the card base upon completion of the IC card.

Since the bent patterns are formed on the circuit board of the IC module between the pattern portion and the outer peripheral portions, bending process can be easily performed with a small amount of heat. Furthermore, the bent portions can be effectively used as reinforcing members for the bent portions.

In the second embodiment, if the cover 12 is made of a transparent material such as BS (butadiene-styrene) resin, the IC module 11 housed in the IC card can be seen. Such an arrangement is advantageous because a user can carefully handle the IC card.

An IC card according to a third embodiment of the present invention will be described below with reference to FIGS. 11 to 13. The same reference numerals in FIGS. 11 to 13 denote the same parts as in the first embodiment.

Figure 11:
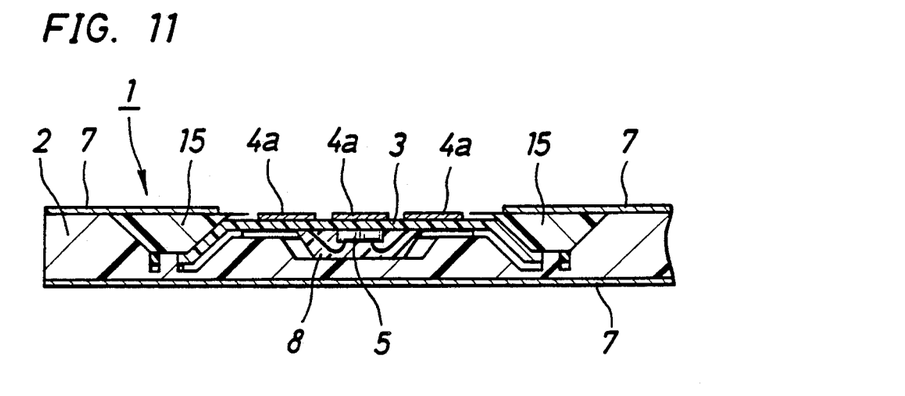
FIG. 11 is a sectional view showing an internal structure of a main part of an IC card according to a third embodiment of the present invention.
Figure 12A:
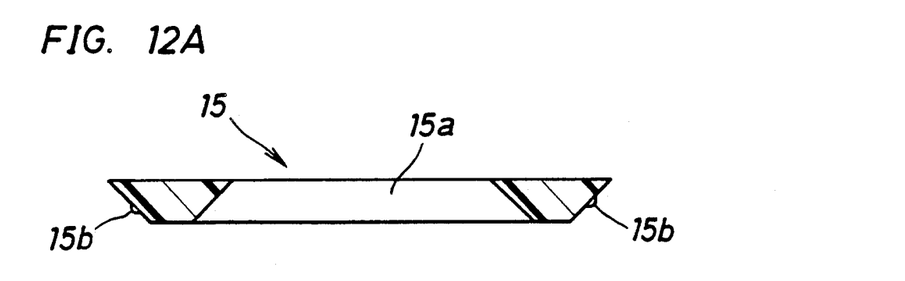
FIG. 12A is a sectional view showing a frame member used for the IC card in FIG. 11.
Figure 12B:
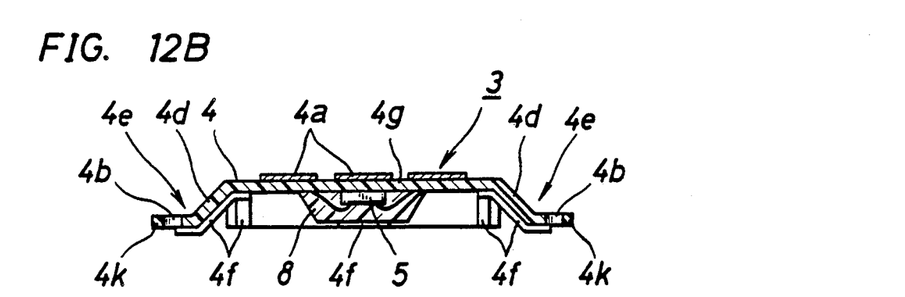
FIG. 12B is a sectional view showing an IC module of the IC card in FIG. 11.

FIG. 11 is a sectional view showing a main part of an IC card according to the third embodiment of the present invention. FIG. 12A is a sectional view of a frame member. FIG. 12B is a sectional view of an IC module. FIG. 12C is a sectional view showing a main part of a card base. FIG. 13 is an exploded perspective view of the IC card according to the third embodiment of the present invention. Note that the outer appearance of the IC card of this embodiment invention is the same as that of the conventional IC card shown in FIG. 1, and hence a description thereof will be omitted.

Components constituting the IC card of this embodiment will be described below with reference to the drawings.

Referring to FIG. 11, an IC card 1 comprises a plastic card base 2 made of, e.g., ABS resin by injection molding, an IC module 3, and a frame member 15 serving as a fixing member.

Figure 12C:
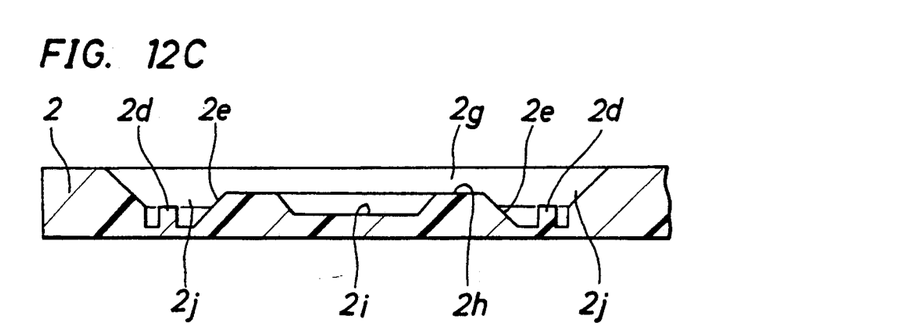
FIG. 12C is a sectional view showing a main part of a card base of the IC card in FIG. 11.
Figure 13:
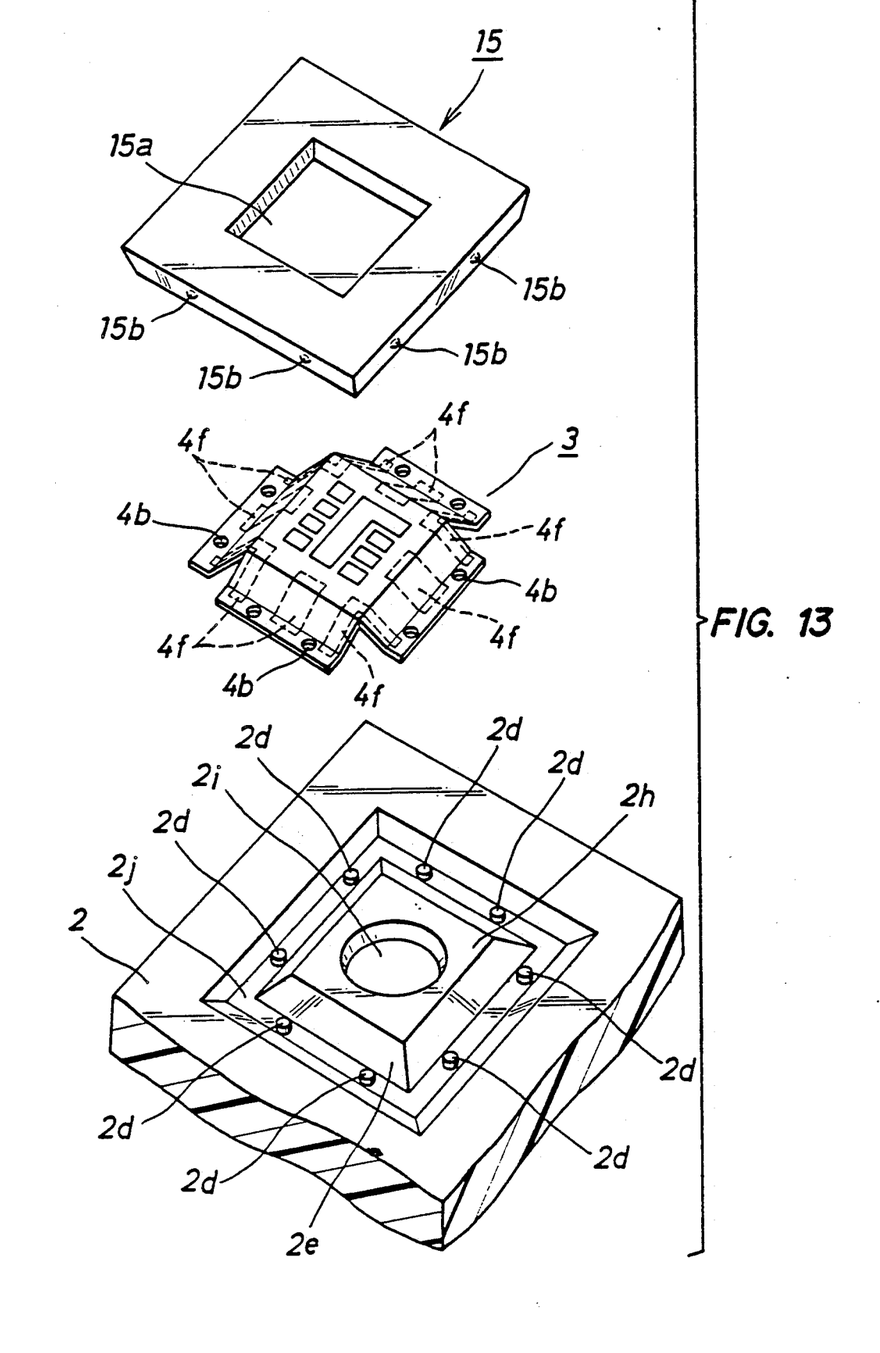
FIG. 13 is an exploded perspective view showing a main part of the IC card in FIG. 11.

As shown in FIG. 12C, a recess 2g for housing the IC module 3 is formed in the card 2. A board holding portion 2h having a trapezoidal section is formed at a central portion of the recess 2g. In addition, a sealing recess 2i is formed at a central portion of the holding portion 2h. Slopes 2e are formed between the upper surface of the holding portion 2h and the bottom surfaces of grooves 2j. A plurality of projections 2d are formed on the bottom surfaces of the grooves 2j.

As shown in FIG. 12B, the IC module 3 includes a flexible circuit board 4 and an IC chip 6. The IC chip 5 is bonded to the lower surface of the circuit board 4, and is protected by a seal portion 8 made of a sealing resin. The circuit board 4 comprises a pattern portion 4g and outer peripheral portions 4e. Contact patterns 4a are formed on the pattern portion 4g. Holes 4b to be engaged with the projections 2d of the card base 2 are formed in the outer peripheral portions 4e. An end portion 4k and a bent portion 4d are formed between the pattern portion 4g and each outer peripheral portion 4e so as to form two folds. The bent portion 4d is formed into a shape corresponding to the shape of the slope 2e of the card base 2. As described above, since the circuit board 4 is flexible, the end and bent portions 4k and 4d are formed by heating/bending the outer peripheral portions 4e of the circuit board.

If the outer peripheral portions 4e are overheated, the circuit board 4 tends to be damaged. For this reason, bent patterns 4f are formed on the lower surface side between the pattern portion 4g and the outer peripheral portions 4e. Similar to the contact patterns 4a, the bent patterns 4f are constituted by copper film patterns, and hence tend to accumulate heat upon heating. Therefore, by forming the bent patterns 4f, heat generated by even a small amount of heating energy is not easily dissipated, so that the end and bent portions 4k and 4d can be easily formed on the circuit board 4.

In addition, the shape retentivity of the bent patterns 4f serves to maintain the shape of the bent portions 4d and enhance the strength of the folds.

As shown in FIG. 12A, the frame member 15 is made of the same plastic material as that of the card base 2 by injection molding. An opening 15a for exposing the contact patterns 4a of the IC module 3 is formed in the frame member 15.

An assembly structure of the IC card 1 will be described below. As shown in FIG. 13, the IC module 3 is housed in the recess 2g from the upper surface of the card base 2 while the bent portions 4d and the end portions 4k are formed on the outer peripheral portions 4e. The pattern portion 4g of the IC module 3 is arranged on the board holding portion 2h. At the same time, the bent portions 4d are arranged on the slopes 2e, and the end portions 4k are arranged on the bottom surfaces of the grooves 2j while the holes 4b are engaged with the projections 2d. In addition, the frame member 15 is mounted in the grooves 2j from the upper surface side of the card base 2. As shown in FIG. 11, the outer peripheral portions 4e of the IC module 3 are firmly clamped between the frame member 15 and the card base 2. Subsequently, the contact surfaces of the frame member 15 and the card base 2 are firmly fixed to each other by ultrasonic fusing. In this embodiment, in order to reliably fix the frame member 15 to the card base 2, projections 15b are formed on the frame member 15 as shown in FIG. 12A. The projections 15A can be reliably brought into contact with surfaces of the grooves 2j, and are fused by ultrasonic fusing. Finally, printed sheets 7 are attached to the upper and lower surfaces of the IC card, and are subjected to antistatic process (neither of the processes are shown), thus completing the IC card 1.

As described above, the IC card 1 of this embodiment can be designed such that the pattern portion 4g of the IC module 3 is placed on the same plane as the surface of the card base 2, and that the IC module 3 can be firmly fixed to the card base 2 without using an adhesive. In addition, fusion marks formed at fused portions of the card base 2 and the frame member 15 can be covered with the sheets 7.

Figure 14:
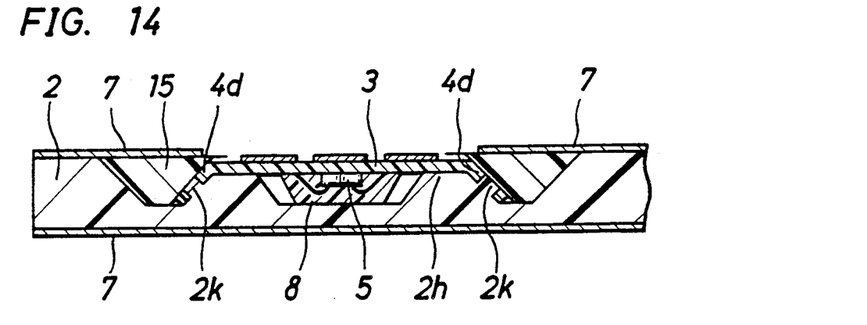
FIG. 14 is a sectional view showing an internal structure of a main part of an IC card according to a fourth embodiment of the present invention.

An IC card according to a fourth embodiment of the present invention will be described below with reference to FIG. 14. Note that the same reference numerals in FIG. 14 denote the same parts as in the third embodiment, and a description thereof will be omitted.

This embodiment is different from the third embodiment in that each bent portion 4d is formed on a circuit board 4 of an IC module 3 so as to have a single fold, and projections formed on the bent portions 4d are respectively engaged with projections 2k formed on a card base 2. Similar to the third embodiment, according to the IC card structure of this embodiment, the IC module 3 can be firmly fixed to the card base 2.

As described above, according to the third and fourth embodiments, a pattern portion on which contact patterns of an IC module are formed is arranged on a board holding portion formed in a recess of a card base, and outer peripheral portions formed by bending the pattern portion are arranged in grooves formed in the periphery of the board holding portion. In addition, a fixing member for fixing the IC module is engaged or fixed into the grooves so as to clamp the outer peripheral portions of the IC module. Therefore, the contact patterns can be arranged on the same plane as the surface of the card base, and the IC module can be firmly fixed to the card base by only fixing the card base and the fixing member to each other by ultrasonic fusing without using an adhesive.

Engaging portions formed on the outer peripheral portions of the IC module are engaged with projections formed on the grooves of the card base and are positioned, so that assembly can be facilitated. In addition, since the card base and the fixing member are fixed to each other through the engaging portions, bonding strength of the card base and the fixing member and fixing strength of the IC module can be increased.

Moreover, since bent patterns are formed between the pattern portion and the outer peripheral portions of the IC module, folds can be easily formed, and strength of the folds, which are susceptible to damage, can be satisfactorily increased.

An IC card according to a fifth embodiment of the present invention will be described below with reference to FIGS. 15 to 17. Note that the same reference numerals in FIGS. 15 to 17 denote the same parts as in the first to fourth embodiments.

Figure 15:
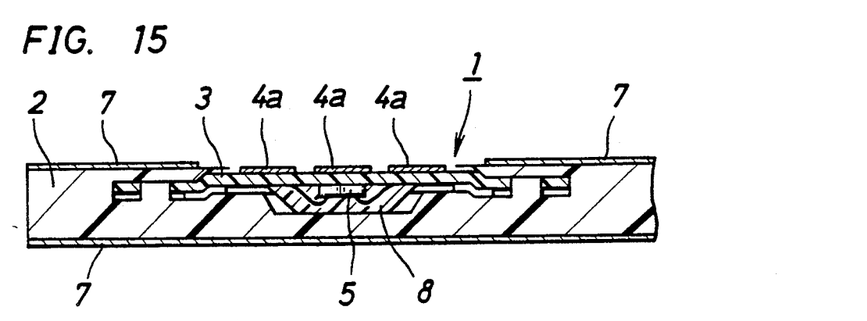
FIG. 15 is a sectional view showing an internal structure of a main part of an IC card according to a fifth embodiment of the present invention.
Figure 16A:
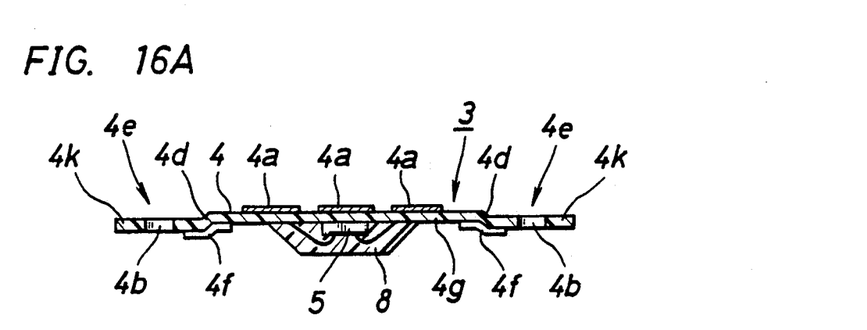
FIG. 16A is a sectional view showing an IC module the IC card in FIG. 15.

FIG. 15 is a sectional view showing a main part of the IC card according to the fifth embodiment of the present invention. FIG. 16A is a sectional view of an IC module. FIG. 16B is a sectional view showing a main part of a card base. FIG. 17 is an exploded perspective view of the IC card in FIG. 15. Note that since the outer appearance of the IC card of the present invention is the same as that of the conventional IC card shown in FIG. 1, a description thereof will be omitted.

Referring to FIG. 15, an IC card 1 comprises a plastic card base 2 made of, e.g., ABS resin by injection molding, and an IC module 3.

Figure 16B:
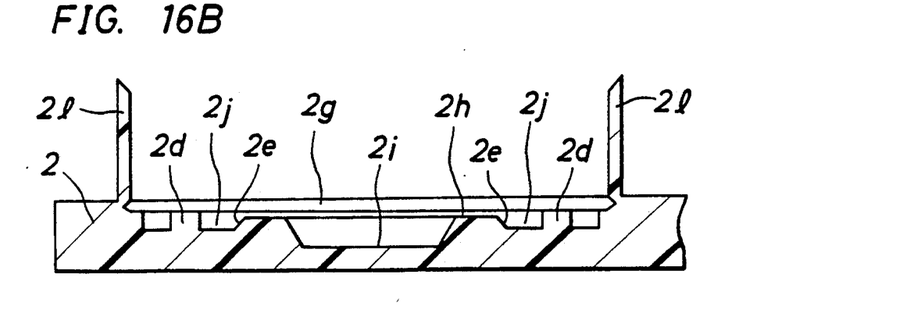
FIG. 16B is a sectional view showing a main part of card base of the IC card in FIG. 15.
Figure 17:
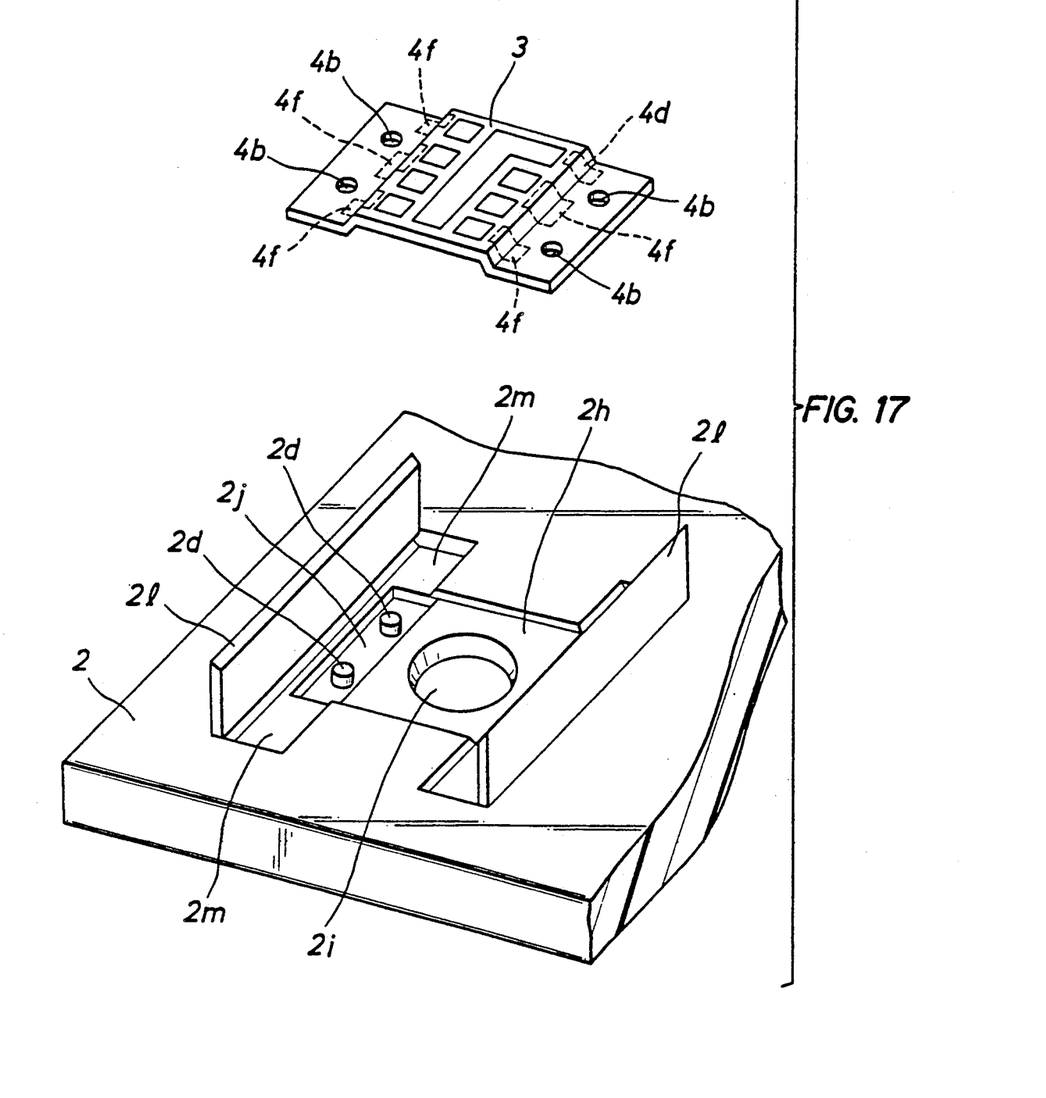
FIG. 17 is an exploded perspective view showing the IC card in FIG. 15.

As shown in FIG. 16B, a recess 2g for housing the IC module 3 is formed in the card base 2. A board holding portion 2h is formed at a central portion of the recess 2g. A sealing recess 2i is formed at a central portion of the board holding portion 2h. Two grooves 2j are formed in the peripheral portions of the board holding portion 2h. Slopes 2e are formed between the upper surface of the board holding portion 2h and the bottom surfaces of the grooves 2j. A plurality of projections 2d are formed on the bottom surfaces of the grooves 2j. In addition, two covers 2l are integrally formed on the peripheral portions of the recess 2g near the grooves 2j.

As shown in FIG. 16A, the IC module 3 comprises a flexible circuit board 4 and an IC chip 5. The IC chip 5 is bonded to the lower surface of the circuit board 4, and is protected by a seal portion 8 of a sealing resin. The circuit board 4 is provided with a pattern portion 4g and outer peripheral portions 4e. Contact patterns 4a are formed on the upper surface of the pattern portion 4g. Each outer peripheral portion 4e consists of a bent portion 4d and an end portion 4k and has two folds. Holes 4b to be engaged with the projections 2d formed on the card base 2 are formed in the end portions 4k. The shapes of pattern portion 4g, the bent portions 4d, and the end portions 4k of the IC module 3 are respectively designed to correspond to those of the board holding portion 2h, the slopes 2e, and the grooves 2j of the card base 2. As described above, since the circuit board 4 is flexible, the bent portions 4d and the end portions 4k are subjected to a bending process while being heated.

Since the circuit board 4 is susceptible to damage if overheated in the bending process, bent patterns 4f are formed on the lower surface of the circuit board 4 between the pattern portion 4g and the end portions 4k. Similar to the contact patterns 4a, the bent patterns 4f are constituted by copper film patterns, and hence, tend to accumulate heat upon heating. Therefore, if the bent patterns 4f are formed, heat generated by even a small amount of energy is not easily dissipated. This facilitates bending of the circuit board 4. Upon bending of the bent patterns 4f, bent shapes can be easily formed. In addition, the bent pattern 4f serves to reinforce the circuit board 4 at the folds.

An assembly structure of the IC card will be described below. As described above, the bent portions 4d and the end portions 4k are formed by bending on the outer peripheral portions 4e of the IC module 3. The IC module 3 is then housed in the recess 2g from the upper surface of the card base 2, as shown in FIG. 17. Subsequently, the pattern portion 4g and the bent portions 4d are respectively arranged on the board holding portion 2h and the slopes 2e, and the end portion 4k are arranged in the grooves 2j while the holes 4b are respectively engaged with the projections 2d.

Each cover 2, which extends perpendicularly with respect to the recess 2g, is bent toward the groove 2j side while a proximal portion of the cover 2l is heated. As a result, the bent portions 4d and the end portions 4k of the IC module 3 are clamped by the covers 2l. In this case, since the sectional shape of each bent portion 4d of the IC module 3 and the shape of each slope 2e of the card base 2 are determined in consideration of the thickness of each cover 2l, the contact patterns 4a of the IC module 3 are arranged on the same plane as the upper surfaces of the covers 2l, i.e., the upper surface of the card base 2, as shown in FIG. 15. The lower surfaces of the covers 2l are brought into contact with recess fusion surfaces 2m and the tips of the projections 2d, and fixed to each other by ultrasonic fusing. As a result, the IC module 3 can be firmly fixed in the recess 2g of the card base 2. Finally, printed sheets 7 of hard coats are attached to the upper and lower surfaces of the card base 2, and the card base 2 is subjected to an antistatic process, thus completing the IC card. Similar to the above-described embodiments, fusion marks formed on fused portions of the covers 2l and the recess fusion surfaces 2m can be covered with the sheets 7.

As is apparent from the above description, according to the IC card structure of the present invention, a pattern portion on which contact patterns of an IC module are formed is arranged in a board holding portion formed in a recess of a card base, and outer peripheral portions formed from the pattern portion upon bending thereof are grooves extending deeper than the board holding portion. In addition, the outer peripheral portions of the IC module in the grooves are clamped by covers integrally formed on the card base, and the covers and the card base are fixed. Therefore, the contact patterns can be arranged on the same plane as the surface of the card base. In addition, the IC module can be firmly fixed to the card base by fixing the card base and the covers to each other by ultrasonic fusing without using an adhesive.

WHAT WE CLAIM IS:

1. An IC card comprising an IC module including a circuit board having contact patterns formed on one surface thereon and an IC chip mounted on the other surface of said circuit board, and a card base for housing said IC module so as to expose the contact patterns, wherein said circuit board of said IC module has a pattern portion on which the contact patterns are formed and a bent portion formed by bending said pattern portion, said card base includes an opening for exposing the contact patterns of said IC module, and a clamping portion, formed on a peripheral portion of said opening, for fixing said bent portion, and said bent portion of said IC module is fixedly clamped by said clamping portion such that the contact patterns are arranged on substantially the same plane as a surface of said card base.

2. An IC card according to claim 1, wherein said card base comprises a first base including a recess for housing said IC chip of said IC module and a descending holding portion for supporting said bent portion of said IC module, and a second base including an opening for exposing the contact patterns of said IC module and a board urging portion which is continuous with said opening and matches with a shape of said bent portion, and said bent portion of said IC module is fixedly clamped by said descending holding portion of said first base and said board urging portion of said second base.

3. An IC card according to claim 2, wherein said first base serves as a base for determining an outer shape of said IC card, and said second base is formed as frame member which can be mounted on said first base.

4. An IC card according to claim 3, wherein a frame member serving as said second base is integrally formed outside said descending holding portion of said first base so as to be bent simultaneously with formation of said first base, and said bent portion is fixedly clamped by arranging said bent portion on said descending holding portion of said first base and bending said frame member.

5. An IC card according to claim 2, wherein said first base is a base for determining an outer shape of said IC card, and said second base is formed as a cover which can be mounted on said first base.

6. An IC card according to claim 5, wherein said cover consists of a transparent member.

7. An IC card according to claim 2, wherein a hole or notched portion is formed in said bent portion of said circuit board constituting said IC module, and a projection is formed on said descending holding portion of said first base or said board urging portion of said second base so that positioning of said IC module is performed by engaging said hole or notched portion of said bent portion with said projection.

8. An IC card according to claim 2, wherein a sheet is attached to a surface of said card base to cover a fused portion of said first and second bases.

9. An IC card according to claim 1, wherein said circuit board of said IC module comprises bent portions on a periphery thereof in four directions.

10. An IC card according to claim 1, wherein a metal thin-film pattern for retaining a shape is formed on a lower surface of said circuit board constituting said IC board, for retaining a shape of said circuit board and the shape of said bent portion is maintained by shape retentivity of said metal thin-film pattern.

* * * * *